United States Patent
Cheng et al.

(10) Patent No.: US 10,672,752 B2
(45) Date of Patent: *Jun. 2, 2020

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Li-Hui Cheng, New Taipei (TW); Jing-Cheng Lin, Hsinchu (TW); Po-Hao Tsai, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/158,244

(22) Filed: Oct. 11, 2018

(65) Prior Publication Data
US 2019/0043849 A1  Feb. 7, 2019

Related U.S. Application Data

(63) Continuation of application No. 15/235,118, filed on Aug. 12, 2016, now Pat. No. 10,134,719.

(Continued)

(51) Int. Cl.
*H01L 25/00* (2006.01)
*H01L 25/10* (2006.01)
(Continued)

(52) U.S. Cl.
CPC .............. *H01L 25/50* (2013.01); *H01L 21/50* (2013.01); *H01L 21/56* (2013.01); *H01L 21/561* (2013.01); *H01L 21/6835* (2013.01); *H01L 23/49805* (2013.01); *H01L 23/5389* (2013.01); *H01L 24/02* (2013.01); *H01L 24/19* (2013.01); *H01L 24/20* (2013.01); *H01L 24/97* (2013.01); *H01L 25/105* (2013.01); *H01L 21/486* (2013.01); *H01L 21/4853* (2013.01); *H01L 21/568* (2013.01); *H01L 23/3128* (2013.01); *H01L 23/49816* (2013.01); *H01L 2021/6009* (2013.01); *H01L 2021/6024* (2013.01); *H01L 2221/68318* (2013.01); *H01L 2221/68345* (2013.01); *H01L 2221/68359* (2013.01); *H01L 2221/68368* (2013.01);
(Continued)

(58) Field of Classification Search
CPC ........................................................ H01L 25/50
See application file for complete search history.

(56) References Cited

U.S. PATENT DOCUMENTS 10,134,719 B2 * 11/2018 Cheng .................... H01L 24/19
2014/0131858 A1 * 5/2014 Pan ......................... H01L 24/13
257/737

* cited by examiner

*Primary Examiner* — Jose R Diaz
(74) *Attorney, Agent, or Firm* — JCIPRNET

(57) ABSTRACT

A semiconductor package and a manufacturing method for the semiconductor package are provided. The semiconductor package has a redistribution layer, at least one die over the redistribution layer, through interlayer vias on the redistribution layer and aside the die and a molding compound encapsulating the die and the through interlayer vias disposed on the redistribution layer. The semiconductor package has connectors connected to the through interlayer vias and a protection film covering the molding compound and the die. The protection film is formed by a printing process.

20 Claims, 13 Drawing Sheets

Related U.S. Application Data

(60) Provisional application No. 62/356,549, filed on Jun. 30, 2016.

(51) Int. Cl.

| | | |
|---|---|---|
| *H01L 21/50* | (2006.01) | |
| *H01L 21/56* | (2006.01) | |
| *H01L 23/00* | (2006.01) | |
| *H01L 21/683* | (2006.01) | |
| *H01L 23/498* | (2006.01) | |
| *H01L 23/538* | (2006.01) | |
| *H01L 23/31* | (2006.01) | |
| *H01L 21/48* | (2006.01) | |
| *H01L 21/60* | (2006.01) | |

(52) U.S. Cl.
CPC ............... *H01L 2224/02311* (2013.01); *H01L 2224/04105* (2013.01); *H01L 2224/12105* (2013.01); *H01L 2224/13024* (2013.01); *H01L 2224/32225* (2013.01); *H01L 2224/73267* (2013.01); *H01L 2224/83191* (2013.01); *H01L 2224/92244* (2013.01); *H01L 2224/97* (2013.01); *H01L 2924/1815* (2013.01); *H01L 2924/37001* (2013.01)

SEMICONDUCTOR PACKAGE AND MANUFACTURING METHOD THEREOF

CROSS-REFERENCE TO RELATED APPLICATION

This application is a continuation application of and claims the priority benefit of U.S. patent application Ser. No. 15/235,118, filed on Aug. 12, 2016 and now allowed, and claims the priority benefits of U.S. provisional application Ser. No. 62/356,549, filed on Jun. 30, 2016. The entirety of each of the above-mentioned patent applications is hereby incorporated by reference herein and made a part of this specification.

BACKGROUND

Wafer level packaging keeps progressing to satisfy the demands of size reduction, high performance interconnects and heterogeneous integration for system-in-package or even system-on-chip.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
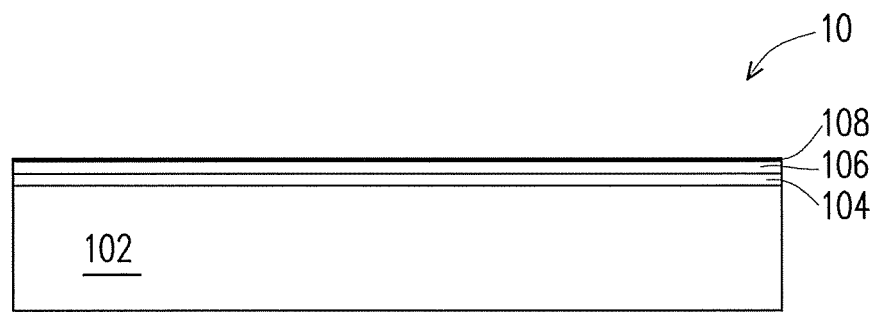
FIG. 1A to FIG. 1J are schematic cross sectional views of various stages in a manufacturing method of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

FIG. 1A to FIG. 1J are schematic cross sectional views of various stages in a manufacturing method of a semiconductor package according to some exemplary embodiments. In exemplary embodiments, the semiconductor manufacturing method is part of a packaging process. In some embodiments, two dies are shown to represent plural dies of the wafer, and one or more packages 10 are shown to represent plural semiconductor packages obtained following the semiconductor manufacturing method.

Referring to FIG. 1A, in some embodiments, a carrier 102 is provided, the carrier 102 may be a glass carrier or any suitable carrier for the manufacturing method of the semiconductor package. In some embodiments, the carrier 102 is provided with a debond layer 104 coated thereon, and the material of the debond layer may be any material suitable for bonding and debonding the carrier 102 from the above layers or wafer disposed thereon. Referring to FIG. 1A, in some embodiments, a dielectric material layer 106 is formed over the carrier 102. In some embodiments, the debond layer 104 includes, for example, a light-to-heat conversion ("LTHC") layer, and such layer enables room temperature debonding from the carrier interface with laser irradiation. In some embodiments, the material of the dielectric material layer 106 includes polyimide, epoxy resin, acrylic resin, phenol resin, benzocyclobutene ("BCB"), polybenzooxazole ("PBO"), or any other suitable polymer-based dielectric material. In one embodiment, the dielectric material layer 106 functions as a buffer layer. As shown in FIG. 1A, in certain embodiments, a seed layer 108 is formed on the dielectric material layer 106.

Figure 1B:
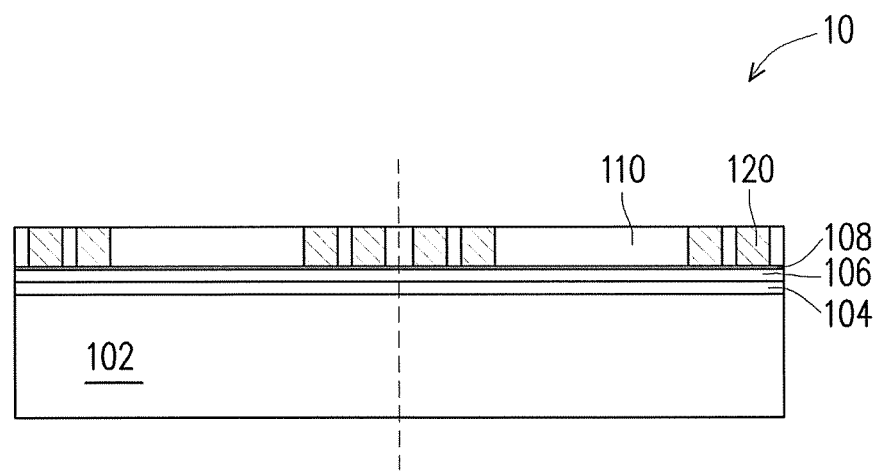

Referring to FIG. 1B, in some embodiments, through interlayer vias ("TIVs") 120 are formed on the seed layer 108 on the carrier 102. In some embodiments, the TIVs 120 are through integrated fan-out ("InFO") vias. In some embodiments, the TIVs 120 are formed by forming a mask pattern 110 with openings on the seed layer 108 to partially expose the seed layer 108, and forming a metallic material filling up the openings to form the TIVs by electroplating or deposition.

Figure 1C:
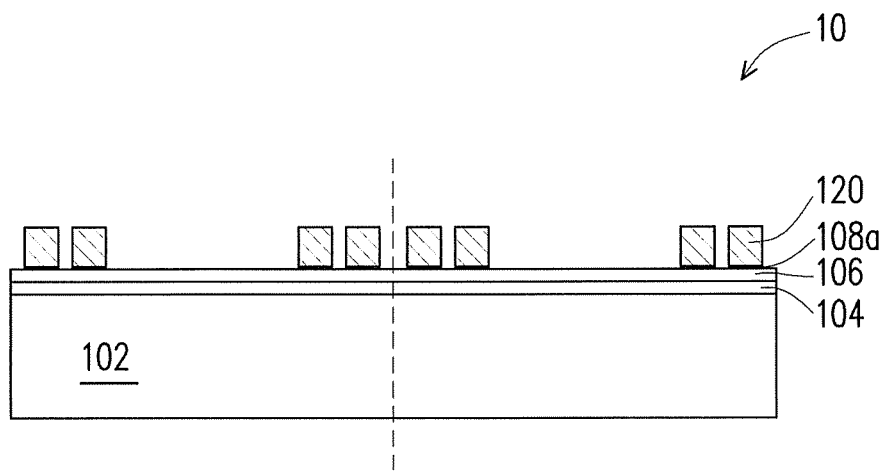

Referring to FIG. 1C, after removing the mask pattern 110, the seed layer 108 is patterned using the TIVs 120 as the masks to form the seed pattern 108a exposing portions of the dielectric material layer 106. In some embodiments, the patterning of the seed layer 108 includes performing at least one anisotropic or isotropic etching process. In certain embodiments, the seed layer 108 is formed by firstly sputtering a composite layer of a titanium layer and a copper seed layer (not shown) conformal to the carrier 102, and a copper or copper alloy layer (not shown) is formed by electroplating to fill the openings of the mask pattern 110 to form the TIVs 120. However, it is appreciated that the scope of this disclosure is not limited to the materials and descriptions disclosed above.

Figure 1D:
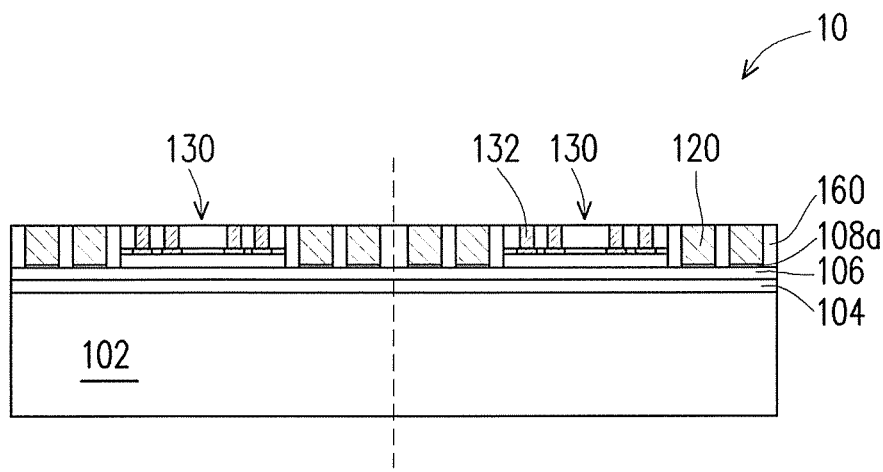

Referring to FIG. 1D, first dies 130 are provided and placed on the exposed dielectric material layer 106 on the carrier 102. In exemplary embodiments, the first dies 130 may include different types of dies or the same types of dies and may be selected from application-specific integrated circuit ("ASIC") chips, analog chips, sensor chips, wireless and radio frequency chips, voltage regulator chips or memory chips. In certain embodiment, a die attach film (not shown) may be provided between the first dies 130 and the dielectric material layer 106 for better adhering. In certain embodiment, as shown in FIG. 1D, the backsides of the first dies 130 are attached to the carrier 102. In some embodiments, the first dies 130 are placed over the carrier 102 and arranged aside the TIVs 120 (within the area surrounding by the TIVs). In some embodiments, as shown in FIG. 1D, the dotted line represents the cutting line of the package 10 and some of the TIVs 120 are arranged close to but not on the cutting line, and are arranged around the first dies 130.

Referring to FIG. 1D, in some embodiments, the first dies 130 and the TIVs 120 located over the carrier 102 beside the first dies 130 are molded and encapsulated in a molding compound 160. In one embodiment, the molding compound 160 fills the space between the first dies 130 and the TIVs 120, and covers the dielectric material layer 106. In one embodiment, the material of the molding compound 160 includes epoxy resins, filler containing epoxy resins, phenolic resins or silicon-containing resins.

Referring to FIG. 1D, in some embodiments, the overmolded molding compound 160 and the TIVs 120 are polished until the contacts 132 of the first dies 130 are exposed. In one embodiment, after the planarization, the TIVs 120 and the molding compound 160 become substantially levelled (i.e. the top surfaces of both are coplanar). In some embodiments, the molding compound 160 and the TIVs 120 are planarized through a grinding process or a chemical mechanical polishing ("CMP") process.

Figure 1E:
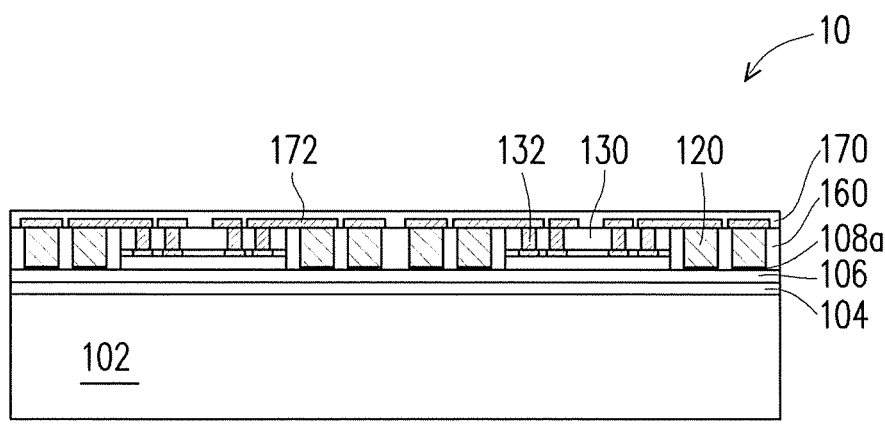

Referring to FIG. 1E, in some embodiments, a redistribution layer 170 is formed on the molding compound 160, on the first dies 130 and on the TIVs 120. In some embodiment, the redistribution layer 170 is electrically connected to the TIVs 120 and the first dies 130. The formation of the redistribution layer 170 includes sequentially forming one or more polymer dielectric material layers and one or more metallization layers in alternation. In certain embodiments, the metallization layers may be sandwiched between the polymer dielectric material layers, but at least the bottom metallization layer 172 is connected to the contacts 132 of the first dies 130 and the TIVs 120. In one embodiment, a dielectric material may be formed between the redistribution layer 170 and the underlying molding compound 160 for better planarization. In some embodiments, the material of the metallization layer(s) includes aluminum, titanium, copper, nickel, tungsten, silver and/or alloys thereof. In some embodiments, the material of the polymer dielectric material layer(s) includes polyimide, epoxy resin, acrylic resin, phenol resin, benzocyclobutene, polybenzooxazole, or any other suitable polymer-based dielectric material. In some embodiments, the redistribution layer 170 is a front-side redistribution layer electrically connected to the first dies 130 and is electrically connected to the TIVs 120.

Figure 1F:
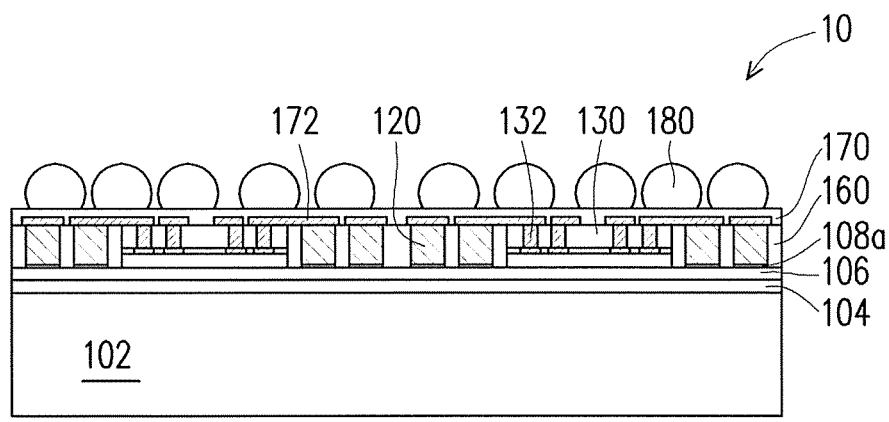

Referring to FIG. 1F, in some embodiments, the conductive elements 180 are disposed on the redistribution layer 170 and are electrically connected to the redistribution layer 170. In some embodiments, prior to disposing the conductive elements 180, solder paste (not shown) or flux is applied so that the conductive elements 180 are better fixed to a top metallization layer (not shown) of the redistribution layer, and the top metallization layer may function as contact pads for the conductive elements 180. In some embodiments, the conductive elements 180 are, for example, solder balls or ball grid array ("BGA") balls placed on the redistribution layer 170 and the top metallization layer underlying the conductive elements 180 functions as ball pads. In some embodiments, some of the conductive elements 180 are electrically connected to the first dies 130 through the redistribution layer 170, and some of the conductive elements 180 are electrically connected to the TIVs 120.

Figure 1G:
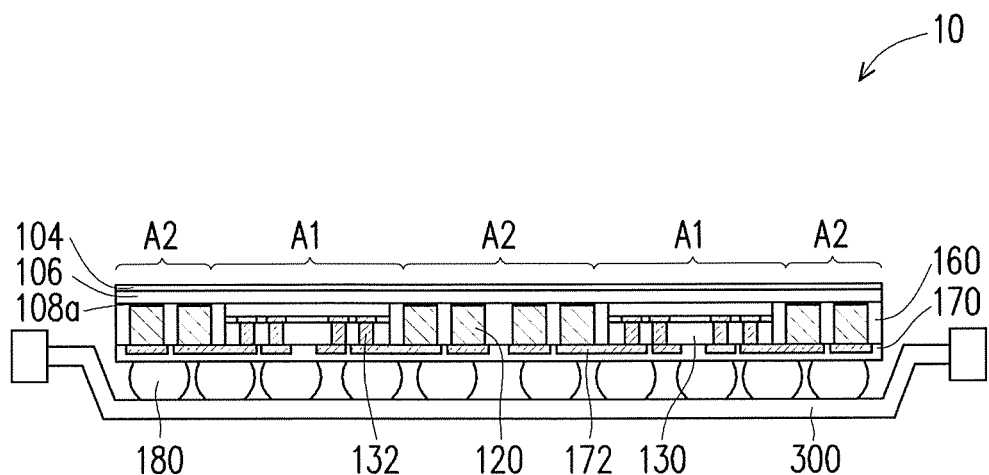

Referring to FIG. 1G, in some embodiments, the package 10 is debonded from the carrier 102 so that the carrier 102 is separated from the first dies 130. The first dies 130 are easily separated from the carrier 102 due to the debond layer 104 of the carrier 102. In some embodiments, after debonding from the carrier 102, some of the debond layer 104 is remained on the package 10 and the package 10 is turned upside down and disposed on a carrier film 300. In some embodiments, the regions where the first dies 130 are disposed are marking areas A1 of the package 10, while the regions where the TIVs 120 are located are open areas A2 of the package 10.

Figure 1H:
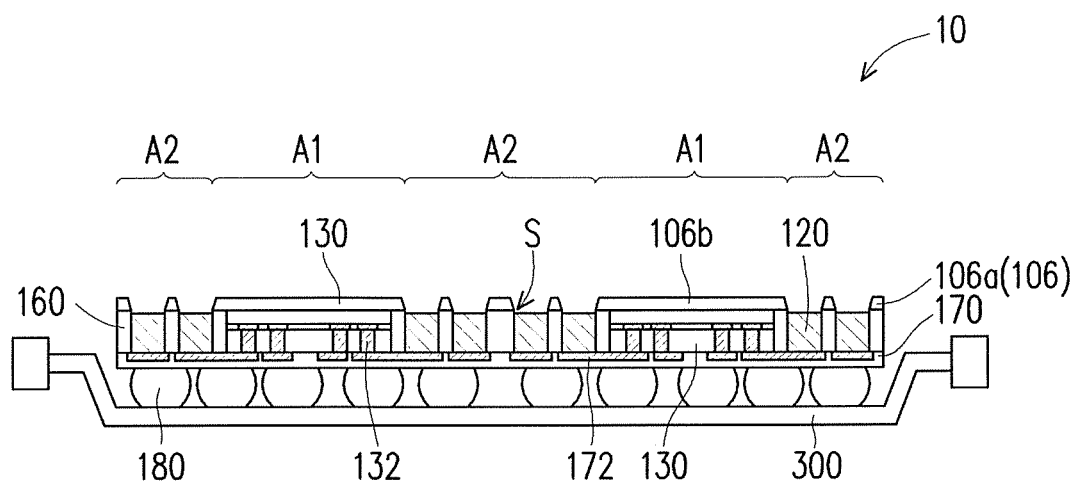

Referring to FIG. 1H, in some embodiments, openings S are formed in the dielectric material layer 106 exposing the TIVs 120 by performing a drilling process. In one embodiment, the drilling process includes a laser drilling process, drilling through the remained debond layer 104 and the dielectric material layer 106 and removing the seed pattern 108a to expose the underlying TIVs 120. The laser drilling process may utilize the laser of various wavelengths depending on the opening or hole diameter and material selection of the drilled layers. In some embodiments, a post-laser cleaning process (PLDC process) is performed and the remained debond layer 104 is removed during the post-laser cleaning process. In one embodiment, the drilled dielectric material layer 106 is not removed and remained on the molding compound 160 (dielectric pattern 106a in the open areas A2) and on the first dies 130 (dielectric pattern 106b in the marking areas A1). In one embodiment, the post-laser cleaning process also includes a wet cleaning process.

Figure 1I:
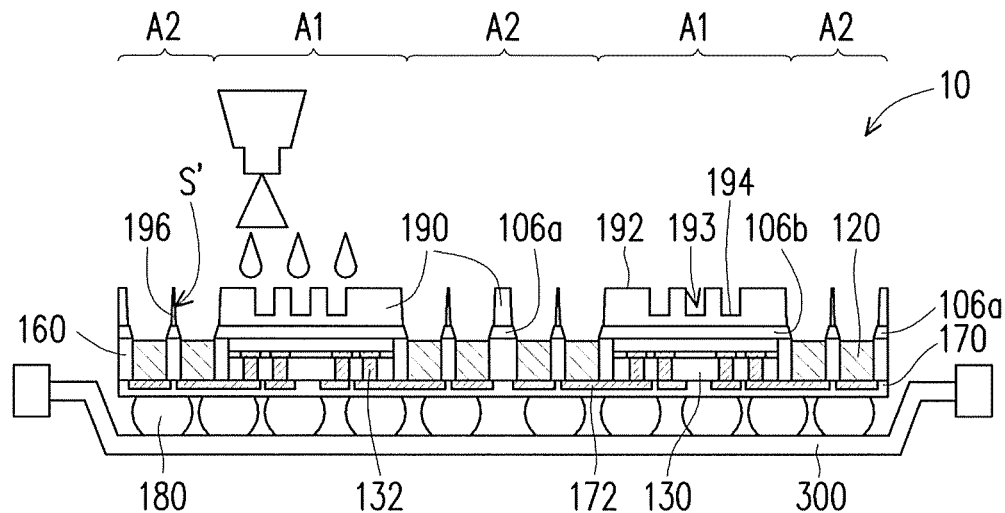
Figure 1I:
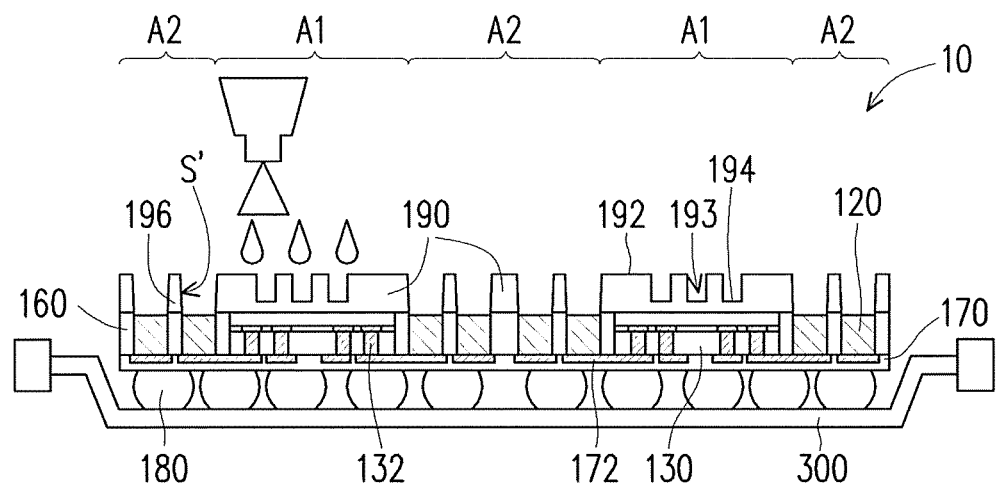

Referring to FIG. 1I, in some embodiments, a protection film 190 is formed on the remained dielectric material layer 106 by performing a printing process. In certain embodiment, the printing process is an inkjet printing process. In one embodiment, the protection film 190 located directly on the dielectric pattern 106a (in the open areas A2) is formed with a via pattern 196 having via openings S'. In certain embodiment, the size W1 of the via openings S' of the via pattern 196 is larger than the size W2 of the openings S in the dielectric pattern 106a, so that the dielectric pattern 106a and the protection film 190 located thereon constitute a step structure (as seen in the partial enlarged view in the lower part of FIG. 4). In some embodiments, through the openings S' of the protection film 190 and the openings S of the dielectric pattern 106a, the TIVs 120 in the open areas A2 are exposed. In one embodiment, from the top view, the larger via openings S' of the via pattern 196 and the exposed dielectric pattern 106a (exposed by the larger via openings S') are shaped as concentric circles surrounding the exposed TIVs 120. In some embodiments, the protection film 190 is a die backside film, and the materials of the protection film 190 include underfill materials, mold compound materials, epoxy resins, polyimide and/or acrylic resins as the matrix material and dyes and filler materials may be additionally added.

In FIG. 1I, in one embodiment, the protection film 190 located on the dielectric pattern 106b (in the marking areas A1) is formed with a trench pattern 192 as the backside marking of the package 10. For example, the marking on the backside may be marking or scribing with characters, numbers, symbols or barcodes, depending on the product design. In certain embodiments, the trench pattern 192 is formed with trenches 193 having substantially flat bottoms 194 (as seen in the partial enlarged view in the upper part of FIG. 4) as the inkjet printing process is applied to form the protection film 190, which leads to precision in aligning and flexibility in the shaping of trench pattern 192. Also, in one embodiment, as the protection film 190 is formed with the trench pattern 192 (the marking) by the printing process, no extra laser marking process is required, and better product throughput, higher product yield and lower costs can be achieved.

In alternative embodiments, in FIG. 1I', the remained debond layer 104 and the dielectric material layer 106 are removed by performing a dry etching process (no laser drilling process is needed), and then followed by forming the protection film 190 on the molding compound 160 with the via pattern 196 corresponding to the TIVs 120 and with the trench pattern 192 directly on the first dies 130. In some embodiments, for the protection film 190 formed directly on the molding compound 160 corresponding to the TIVs 120, the size W1 of the via openings S' of the via pattern 196 is substantially equivalent or smaller than to the critical dimension of the TIVs 120.

Figure 1J:
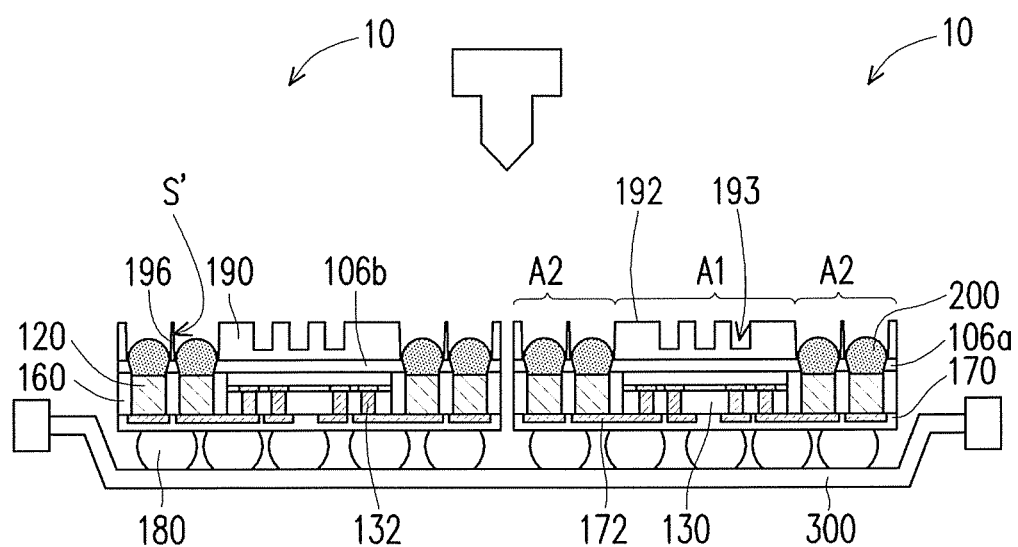

Referring to FIG. 1J, in some embodiments, connectors 200 are formed on the TIVs 120 in the open areas A2. In certain embodiments, the connectors 200 are solder bumps formed by performing a solder on pad ("SOP") process. In exemplary embodiments, the connectors 200 are located on the TIVs 120 and within the openings S of the dielectric pattern 106a and within the openings S' of the via pattern 196 of the protection film 190. In FIG. 1J, the connectors 200 are lower than the protection film 190. In alternative embodiments, the tops 200a of the connectors 200 may be substantially level with or higher than the top surface 190a of the protection film 190. Subsequently, a dicing process is performed to cut the whole package structure (at least cutting though the protection film 190, the molding compound 160 and the redistribution layer 170) along the cutting line (the dotted line) into individual and separated semiconductor packages 10. In one embodiment, the dicing process is a wafer dicing process including mechanical blade sawing or laser cutting.

In exemplary embodiments, the manufacturing method described above is part of a packaging process, and a plurality of semiconductor packages 10 are obtained after the wafer dicing process. In the subsequent processes, the semiconductor package structure 10 may be further mounted with additional packages, dies or other electronic devices.

Figure 2A:
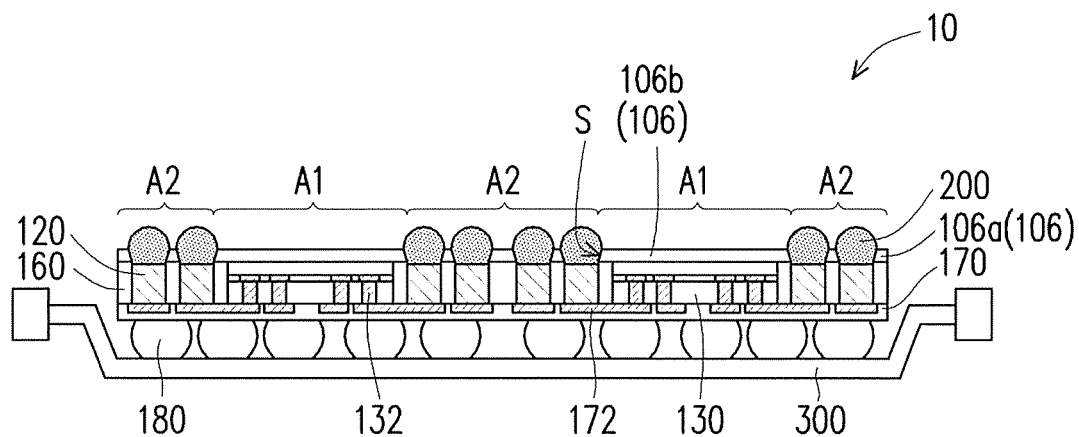
FIG. 2A-2B is a schematic cross sectional view illustrating a semiconductor package according to some exemplary embodiments of the present disclosure.
Figure 2B:
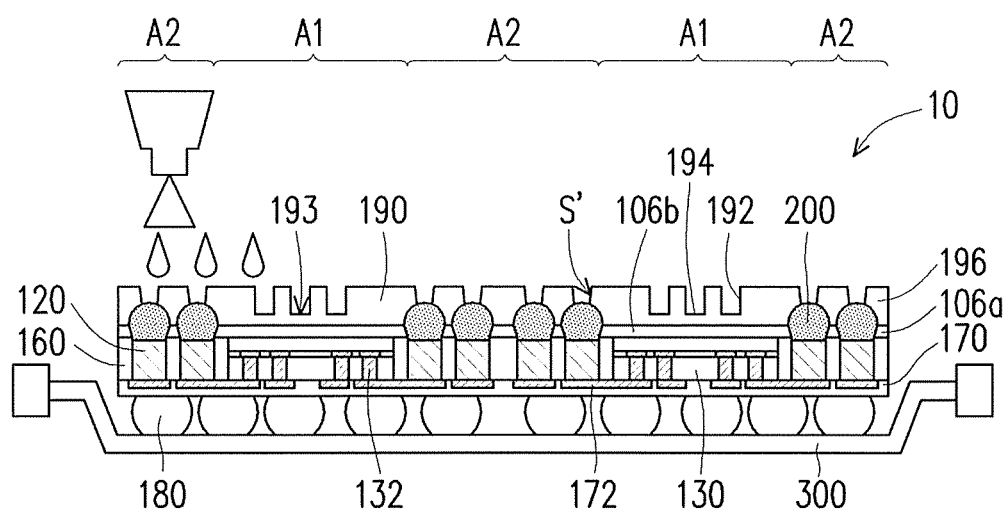

FIG. 2A to FIG. 2B are schematic cross sectional views of various stages in a manufacturing method of a semiconductor package according to some exemplary embodiments. The semiconductor package 10 of FIG. 2A may be fabricated following the previously described manufacturing process as described in FIG. 1A-1H. The elements similar to or substantially the same as the elements described in FIG. 1A-1H will use the same reference numbers, and certain details or descriptions of the same elements will not be repeated herein. Referring to FIG. 2A, in some embodiments, after the formation of the openings S of the dielectric pattern 106a, connectors 200 are formed on the TIVs 120 in the open areas A2. In certain embodiments, the connectors 200 are solder bumps formed by performing a solder on pad (SOP) process. In exemplary embodiments, the connectors 200 are located on the TIVs 120 and within the openings S of the dielectric pattern 106a. In FIG. 2A, the connectors 200 are higher than the dielectric material layer 106.

In FIG. 2B, in some embodiments, a protection film 190 is formed on the dielectric material layer 106 by performing a printing process. In certain embodiment, the printing process is an inkjet printing process. In one embodiment, the protection film 190 located directly on the dielectric pattern 106a in the open areas A2 is formed with a via pattern 196 having via openings S'. In certain embodiment, the size W1 of the via openings S' of the via pattern 196 is smaller than the size W2 of the openings S in the dielectric pattern 106a, and the protection film 190 covers portions of the connectors 200 (as seen in the partial enlarged view in the lower part of FIG. 5). In some embodiments, through the openings S' of the protection film 190, the connectors 200 in the open areas A2 are exposed.

In FIG. 2B, in certain embodiment, the connectors 200 are lower than the protection film 190. In alternative embodiments, the tops 200a of the connectors 200 may be substantially level with or higher than the top surface 190a of the protection film 190. In alternative embodiments, individual and separated semiconductor packages 10 are obtained after subsequently performing a dicing process.

Figure 4:
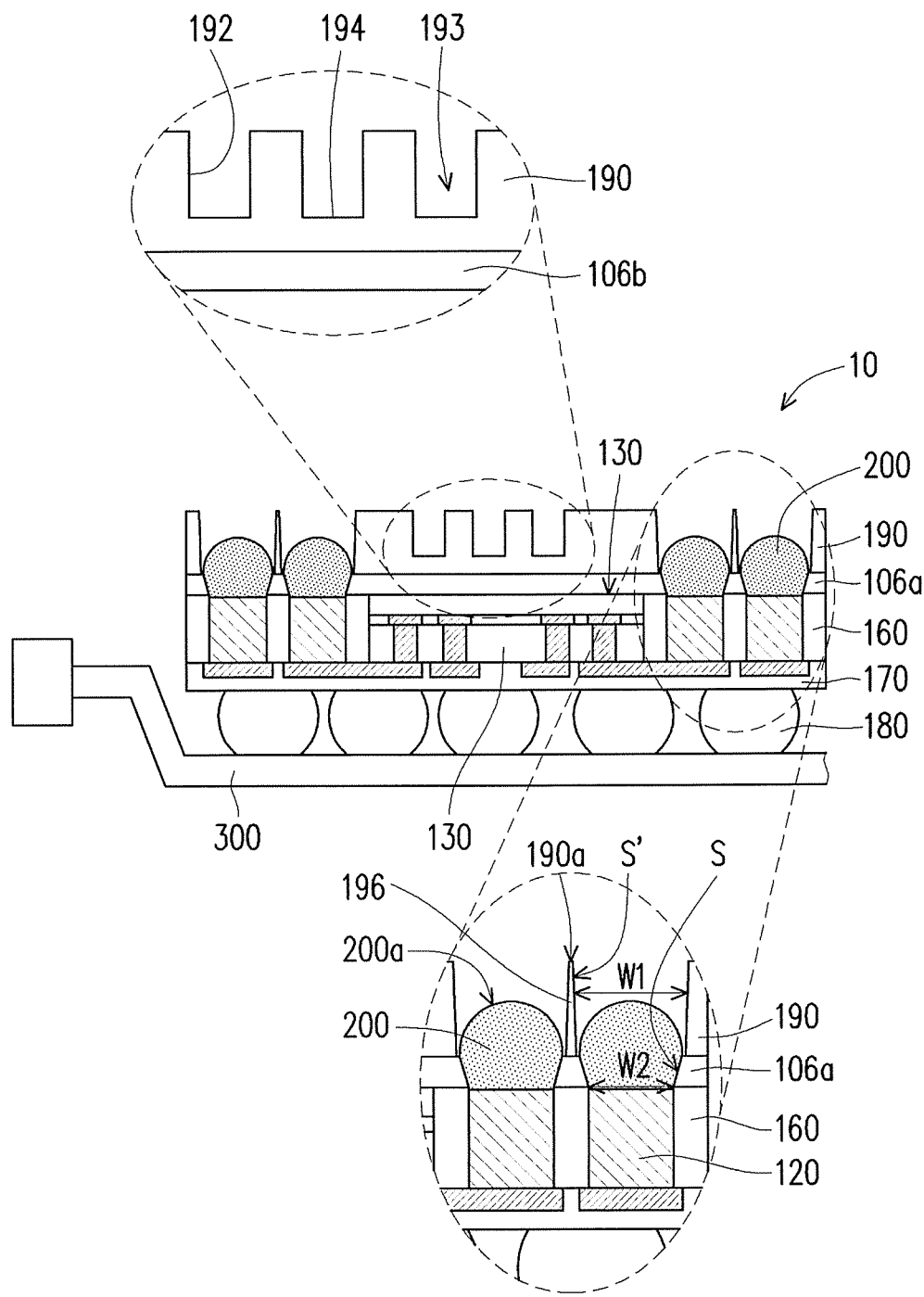
FIG. 4-7 are schematic cross sectional views illustrating various semiconductor packages according to some exemplary embodiments of the present disclosure.
Figure 5:
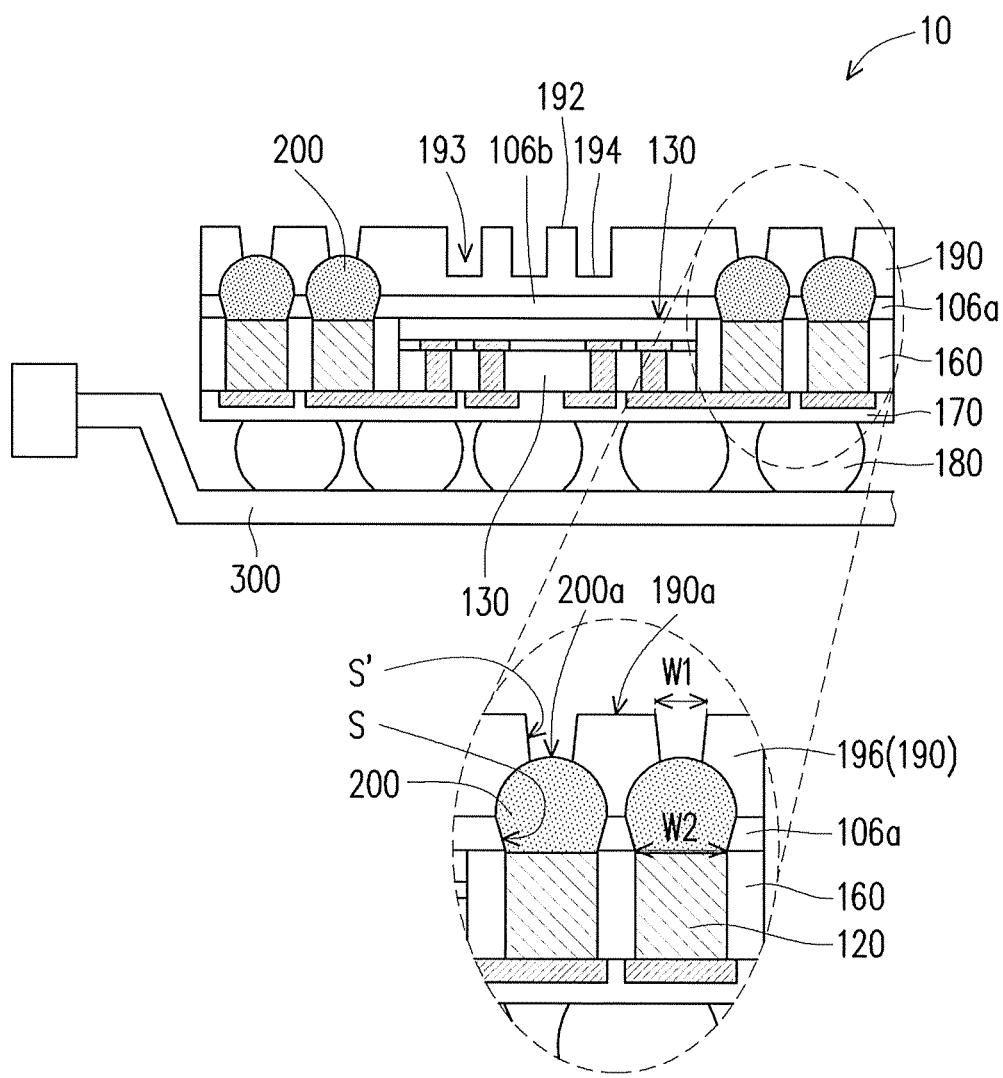

Referring to FIGS. 4 & 5, the semiconductor package 10 includes the protection film 190, the connectors 200, the TIVs 120, the first die 130, the molding compound 160, the redistribution layer 170 and the conductive elements 180. In some embodiments, the first die 130 and the TIVs 120 are locate on the redistribution layer 170 and are electrically connected to the redistribution layer 170, while the molding compound 160 located on the redistribution layer 170 encapsulates the first die 130 and the TIVs 120. In some embodiments, the protection film 190 is disposed on the molding compound 160 and the first die 130 along with a dielectric material layer 106 disposed between the protection film 190 and the molding compound 160 and the first die 130. In some embodiments, the first die 130, the TIVs 120 and the molding compound 160 are sandwiched between the protection film 190, the dielectric material layer 106 and the redistribution layer 170. In certain embodiment, the dielectric material layer 106 includes a dielectric pattern 106a located on the molding compound 160 and a dielectric pattern 106b located on the first die 130. In certain embodiment, the protection film 190 located on the dielectric pattern 106a has a via pattern 196 with via openings S' exposing the TIVs 120. In some embodiments, the connectors 200 are located on the TIVs 120 and within the openings S of the dielectric pattern 106a. In certain embodiment, the protection film 190 located on the dielectric pattern 106b has a trench pattern 192 with trenches 193, and the trenches 193 have substantially flat bottoms 194. In some embodiments, the TIVs 120 penetrating through the molding compound 160 are arranged aside the first die 130. In FIGS. 4 & 5, in certain embodiment, the connectors 200 are lower than the protection film 190. In alternative embodiments, the connectors 200 may be substantially level with or higher than the protection film 190.

In exemplary embodiments, as shown in FIG. 4, the size W1 of the via openings S' of the via pattern 196 is larger than the size W2 of the openings S in the dielectric pattern 106a, so that the dielectric pattern 106a and the protection film 190 located thereon constitute a step structure (as seen in the partial enlarged view in the lower part of FIG. 4). In some embodiments, in FIG. 4, the connectors 200 located on the TIVs 120 are located within the openings S of the dielectric pattern 106a and the via openings S' of the protection film 190.

In certain embodiment, as shown in FIG. 5, the size W1 of the via openings S' of the via pattern 196 is smaller than the size W2 of the openings S in the dielectric pattern 106a, and the protection film 190 covers portions of the connectors 200 (as seen in the partial enlarged view in the lower part of FIG. 5). In some embodiments, the connectors 200 located on the TIVs 120 are located within the openings S of the dielectric pattern 106a and are exposed by the via openings S' of the protection film 190.

Figure 6:
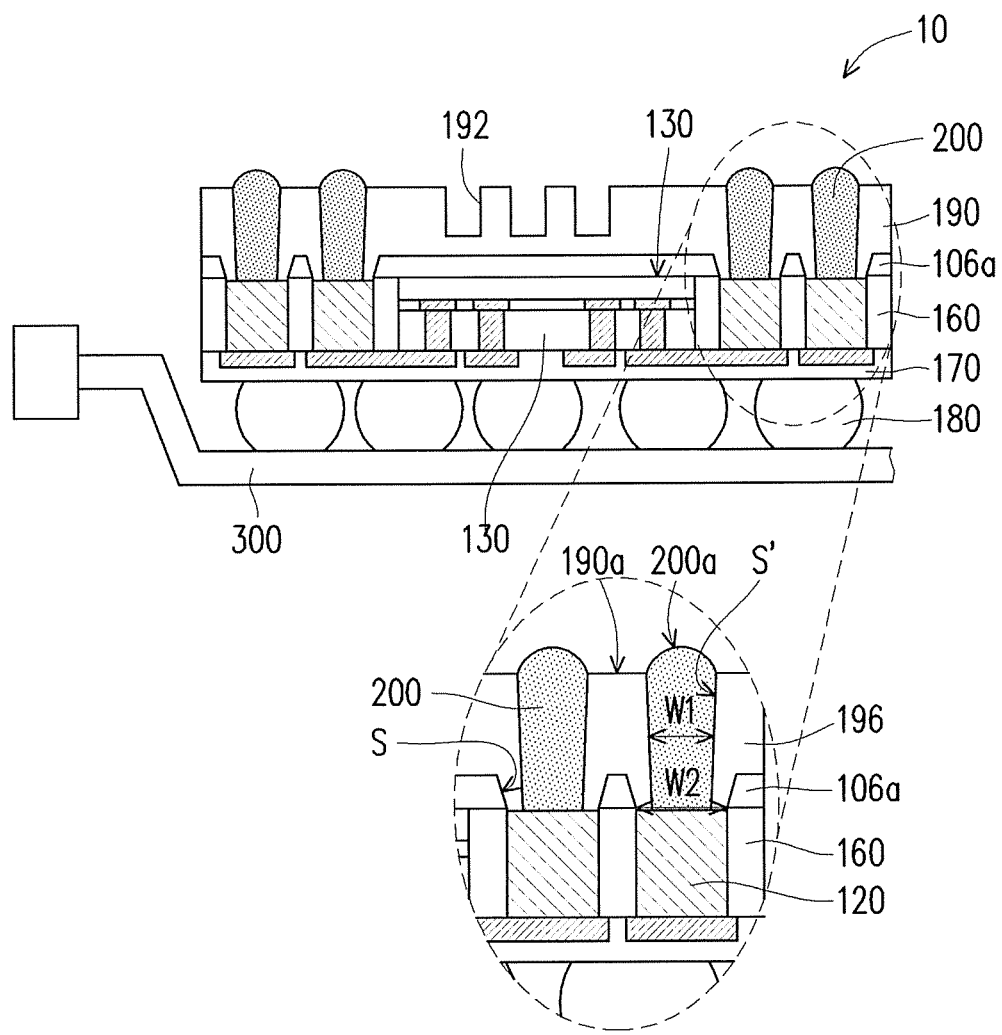

Referring to FIG. 6, in alternative embodiments, after the formation of the openings S of the dielectric pattern 106a, the protection film 190 is then formed on the dielectric material layer 106 by performing a printing process. In one embodiment, the size W1 of the via openings S' of the via pattern 196 is smaller than the size W2 of the openings S in the dielectric pattern 106a, and the protection film 190 covers the dielectric patterns 106a, 106b, sidewalls of the openings S and portions of the TIVs 120 (as seen in the partial enlarged view in the lower part of FIG. 6). In some embodiments, after the protection film 190 is formed, connectors 200 are formed within the via openings S' of the via pattern 196 of the protection film 190 and the connectors 200 are in direct contact with the protection film 190 and located directly on the TIVs 120. In exemplary embodiments, the connectors 200 are higher than the protection film 190. That is, the tops 200a of the connectors 200 are higher than the top surface 190a of the protection film 190.

Figure 7:
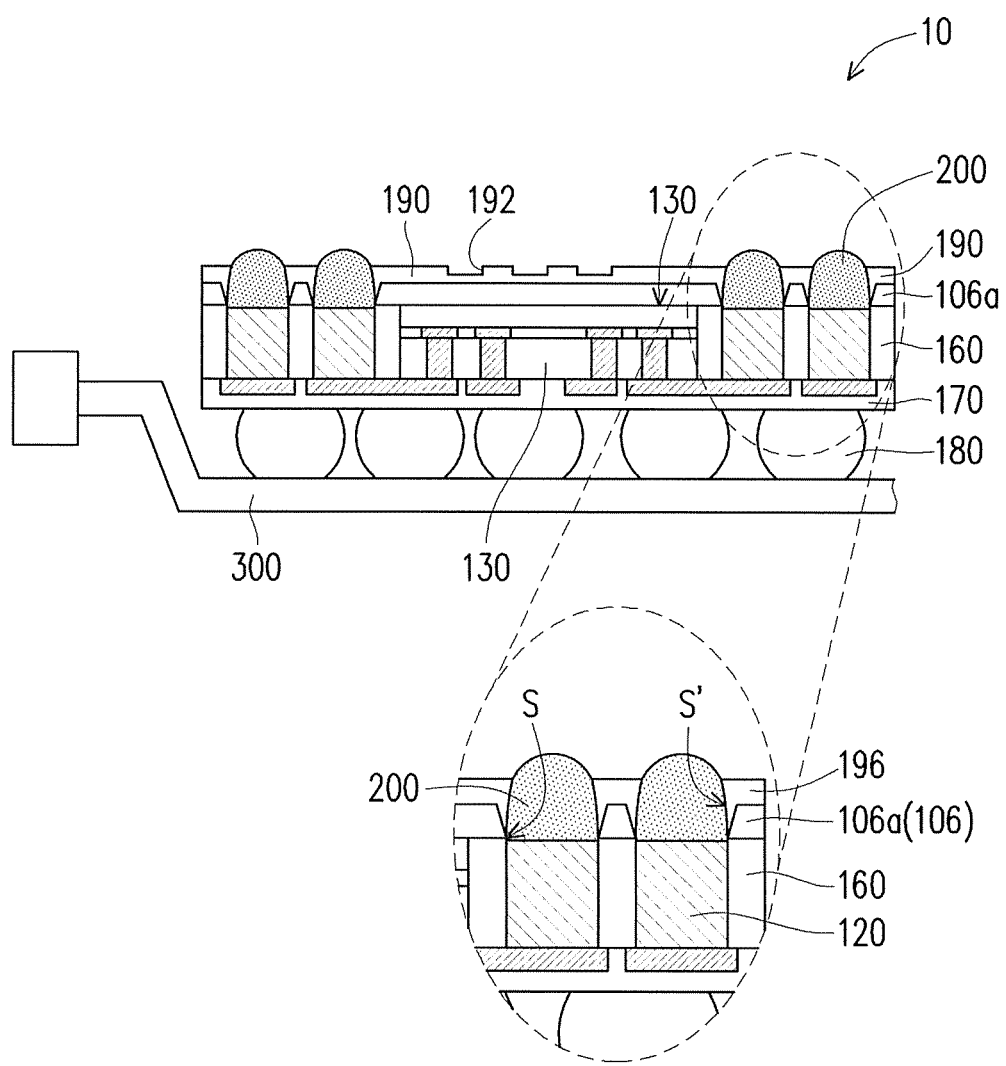

Referring to FIG. 7, in alternative embodiments, after the formation of the openings S of the dielectric pattern 106a, the connectors 200 are formed within the openings S of the dielectric pattern 106a. In exemplary embodiments, the connectors 200 are higher than the dielectric material layer 106. In some embodiments, the protection film 190 is then formed on the dielectric material layer 106 by performing a printing process. In one embodiment, the protection film 190 covers the dielectric patterns 106a, 106b and portions of the connectors 200 (as seen in the partial enlarged view in the lower part of FIG. 7). In some embodiments, the connectors 200 are exposed from and protruded out of the via openings S' of the via pattern 196 of the protection film 190. In exemplary embodiments, the connectors 200 are higher than the protection film 190.

In alternative embodiments, the intermediate structure or the final semiconductor package 10 may be further applied and packaged with another package(s) and/or additional dies over the first die 130, and one or more redistribution layer(s) may be adjusted to electrically connect another package(s) and/or the additional dies. The structures and/or the process of the present disclosure are not limited by the exemplary embodiments.

Figure 3A:
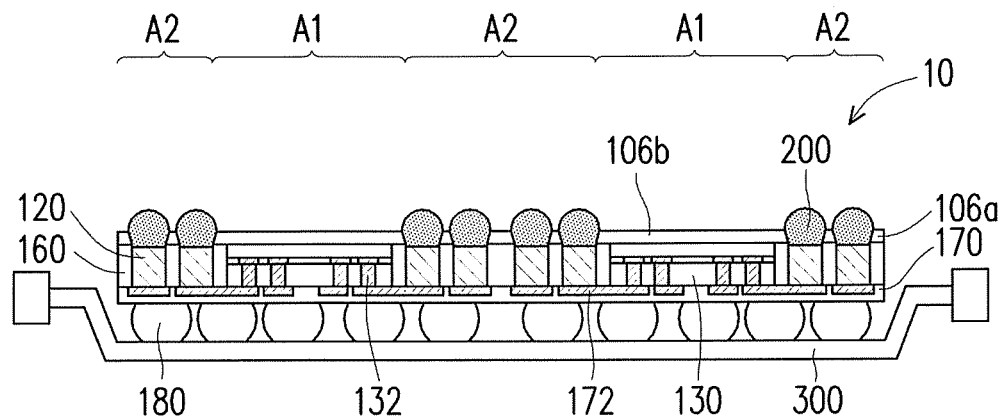
FIG. 3A to FIG. 3D are schematic cross sectional views of various stages in a manufacturing method of a semiconductor package according to some exemplary embodiments of the present disclosure.

FIG. 3A to FIG. 3D are schematic cross sectional views of various stages in a manufacturing method of a semiconductor package according to some exemplary embodiments. In FIG. 3A, in exemplary embodiments, a semiconductor package 10 is provided, and the semiconductor package 10 is similar to the package 10 as seen in FIG. 2A and may be fabricated following the previously described manufacturing process as described in FIG. 1A-1H. The elements similar to or substantially the same as the elements described above will use the same reference numbers, and certain details or descriptions of the same elements will not be repeated herein.

Figure 3B:
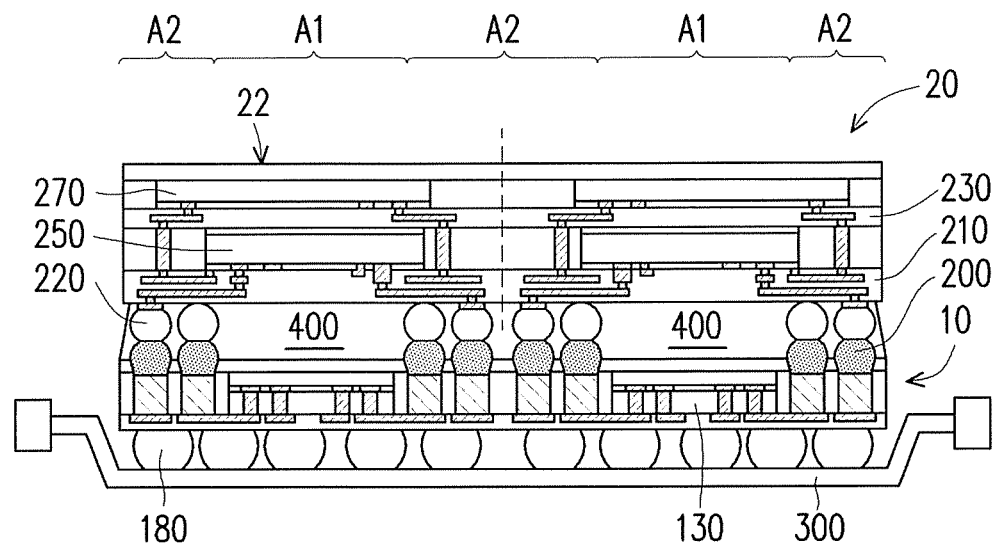

Referring to FIG. 3B, in some embodiments, one or more second semiconductor packages 20 are provided and disposed on the semiconductor package 10. In exemplary embodiments, the second semiconductor package 20 includes dies 250, 270 stack over each one and at least one redistribution layer 210 and interconnect structures 230 for connecting the dies 250, 270. In some embodiments, the second semiconductor packages 20 are electrically connected to the semiconductor package 10 through the connection of the connectors 200 and the connectors 220 of the second semiconductor packages 20. In some embodiments, at least one of the dies 250, 270 is electrically connected with the conductive elements 180 and/or the die 130. In some embodiments, an underfill material 400 is filled between the second semiconductor packages 20 and the semiconductor package 10.

Figure 3C:
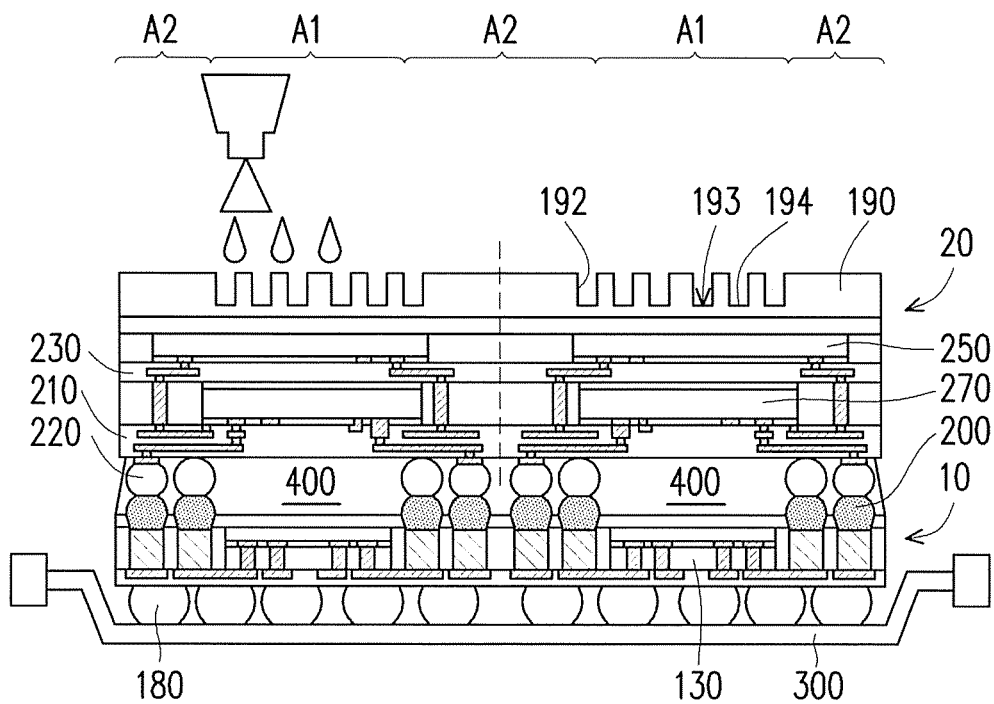

Referring to FIG. 3C, a protection film 190 is then formed on the backsides 22 of the second semiconductor packages 20 by performing a printing process. In certain embodiment, the printing process includes an inkjet printing process. In one embodiment, the protection film 190 located on the backsides 22 of the second semiconductor packages 20 is formed with a trench pattern 192 as the backside marking of the whole package. For example, the marking on the backside may be marking or scribing with characters, numbers, symbols or barcodes, depending on the product design. In certain embodiments, the trench pattern 192 is formed with trenches 193 having substantially flat bottoms 194 as the inkjet printing process is applied to form the protection film 190, which leads to precision in aligning and flexibility in the shaping of trench pattern 192.

Figure 3D:
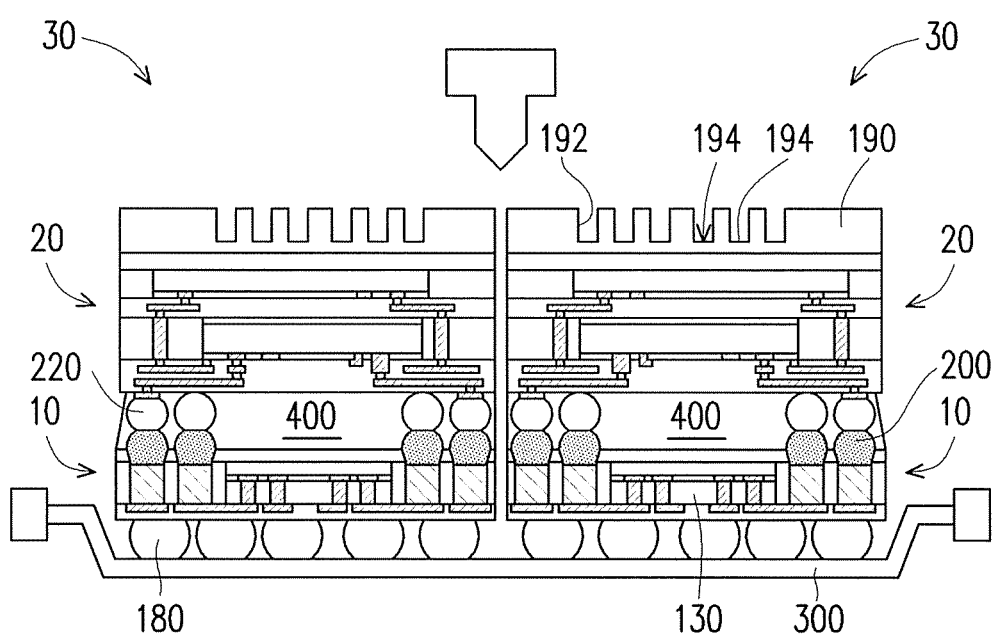

Referring to FIG. 3D, a dicing process is performed to cut the whole package structure (at least cutting though the protection film 190 and the packages 10, 20) along the cutting line (the dotted line) into individual and separated semiconductor packages 30. In one embodiment, the dicing process is a wafer dicing process including mechanical blade sawing or laser cutting.

The backside marking formed by printing has precise and uniform outline. As no extra laser marking process is required for forming the backside marking (i.e. the protection film with patterns) as described in the above embodiments, film damages or delamination caused by the laser marking process is avoided and the package can be fabricated with higher product throughput and yield.

According to some embodiments, a semiconductor package has a redistribution layer, at least one die, a molding compound, through interlayer vias, a protection film, connectors and conductive elements. The at least one die is disposed over the redistribution layer. The molding compound is disposed on the redistribution layer and encapsulates the at least one die. The through interlayer vias penetrating through the molding compound are disposed on the redistribution layer and are electrically connected to the redistribution layer and the at least one die. The protection film is disposed on the molding compound and the at least one die. The protection film located on the at least one die includes a trench pattern with trenches of substantially flat bottoms. The connectors are disposed on the through interlayer vias. The conductive elements are electrically connected to the redistribution layer.

According to some embodiments, a semiconductor package has a redistribution layer, at least one die, through interlayer vias, a molding compound, a dielectric material layer, a protection film, connectors and conductive elements. The at least one die is disposed over the redistribution layer. The through interlayer vias are disposed on the redistribution layer and arranged aside of the at least one die. The molding compound is disposed on the redistribution layer and encapsulates the at least one die and the through interlayer vias. The though interlayer vias are electrically connected to the redistribution layer and the at least one die. The dielectric material layer is disposed on the molding compound and the at least one die, and the dielectric material layer includes a first dielectric pattern disposed on the at least one die. The protection film is disposed over the molding compound and the at least one die and disposed on the dielectric material layer. The protection film located on the first dielectric pattern and above the at least one die includes a trench pattern with trenches of substantially flat bottoms. The connectors are disposed on the through interlayer vias. The conductive elements are electrically connected to the redistribution layer.

According to some embodiments, a manufacturing method for semiconductor packages is provided. A buffer layer is formed on a carrier. Through interlayer vias are formed on the buffer layer and over the carrier. A plurality of dies is disposed on the buffer layer and aside the through interlayer vias. A molding compound is formed over the buffer layer and over the carrier, encapsulating the plurality of dies and the through interlayer vias. A redistribution layer is formed on the molding compound, on the through interlayer vias and on the plurality of dies. The through interlayer vias are electrically connected to the redistribution layer. Conductive elements are disposed on the redistribution layer. The carrier is removed to expose the buffer layer and the buffer layer is removed. A protection film is formed over the molding compound and the plurality of dies by a printing process but exposing the through interlayer vias. Connectors are formed on the through interlayer vias. A dicing process is performed cutting through the molding compound and the redistribution layer to separate the semiconductor packages.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method, comprising:
providing a carrier having a buffer layer thereon;
providing sub-packages each having a die and a through interlayer via on the buffer layer and encapsulating the sub-packages with a molding compound;
removing the carrier to expose the buffer layer;
removing the buffer layer to at least expose the through interlayer vias;
printing a protection film over the molding compound and the backsides of the dies, wherein the protection film is printed over the backsides of the dies with trenches concave into the protection film without penetrating through the protection film;
forming connectors on the through interlayer vias; and
performing a dicing process cutting through the molding compound.

2. The method as claimed in claim 1, wherein removing the buffer layer comprises partially removing the buffer layer to form a dielectric pattern fully covering backsides of the dies and exposing the through interlayer vias.

3. The method as claimed in claim 2, wherein removing the buffer layer comprises laser drilling through the buffer layer to form openings exposing the through interlayer vias and to form the dielectric pattern.

4. The method as claimed in claim 1, wherein removing the buffer layer comprises completely removing the buffer layer to expose the backsides of the dies and the molding compound.

5. The method as claimed in claim 1, wherein printing a protection film comprises performing an inkjet printing process to print the protection film with vias patterns on the molding compound and exposing the through interlayer vias.

6. The method as claimed in claim 3, wherein the connectors are formed in the openings of the buffer layer after printing the protection film.

7. The method as claimed in claim 6, wherein the protection film is printed to cover sidewalls of the openings of the buffer layer but expose the through interlayer vias.

8. The method as claimed in claim 6, wherein the protection film is printed on the buffer layer to expose portions of the buffer layer around the openings and expose the through interlayer vias.

9. The method as claimed in claim 3, wherein the connectors are formed in the openings of the buffer layer before printing the protection film.

10. A semiconductor package comprising:
at least one die encapsulated by a molding compound;
a redistribution layer, disposed on the molding compound and over a front-side of the at least one die and electrically connected with the at least one die;
through interlayer vias, disposed aside the at least one die, penetrating the molding compound and electrically connected with the redistribution layer and the at least one die; and
a backside film, disposed on the molding compound and over a backside of the at least one die, wherein the backside film that is located on the at least one die includes trenches with substantially flat bottoms, and the trenches are free from a conductive connector.

11. The semiconductor package as claimed in claim 10, further comprising connectors disposed on the through interlayer vias, wherein the backside film that is located aside the at least one die includes through openings and the connectors disposed on the through interlayer vias are located within the through openings.

12. The semiconductor package as claimed in claim 11, wherein the connectors are protruded from the backside film.

13. The semiconductor package as claimed in claim 11, wherein tops of the connectors are lower than a top surface of the backside film.

14. The semiconductor package as claimed in claim 10, further comprising connectors disposed on the through interlayer vias, wherein the backside film that is located over the through interlayer vias covers the connectors and includes vias exposing the connectors.

15. The semiconductor package as claimed in claim 14, further comprising a dielectric material layer disposed on the molding compound, on the at least one die and disposed between the molding compound, the at least one die and the backside film, wherein the dielectric material layer fully covers the at least one die and has openings exposing the through interlayer vias.

16. The semiconductor package as claimed in claim 15, wherein the backside film covers sidewalls of the openings of the dielectric material layer and the connectors are in direct contact with the backside film.

17. The semiconductor package as claimed in claim 15, wherein the backside film disposed on the dielectric material layer exposes portions of the dielectric material layer to constitute a step structure around the openings.

18. A semiconductor package comprising:
- a first package having at least one first die;
- a second package, having at least one second die and mounted on the first package;
- connectors, disposed between the first and second packages and electrically connecting the first and second packages; and
- a backside film, disposed on a backside of the at least one second die, wherein the backside film that is located on the at least one second die includes trenches with substantially flat bottoms, and the trenches are free from a conductor.

19. The semiconductor package as claimed in claim 18, wherein the second package further comprises a dielectric material layer disposed on the at least one second die and disposed between the at least one second die and the backside film.

20. The semiconductor package as claimed in claim 18, wherein the trenches include marking patterns.

* * * * *